United States Patent
Marr

(10) Patent No.: US 6,914,306 B1
(45) Date of Patent: Jul. 5, 2005

(54) ELECTROSTATIC DISCHARGE PROTECTION DEVICE

(75) Inventor: Kenneth W. Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/648,919

(22) Filed: Aug. 25, 2000

(51) Int. Cl.[7] .............................................. H01L 23/62
(52) U.S. Cl. ...................................... 257/362; 257/356
(58) Field of Search .............................. 257/355, 356, 257/357, 361, 362

(56) References Cited

U.S. PATENT DOCUMENTS

| | | | |
|---|---|---|---|
| 4,602,266 A | | 7/1986 | Coe ............................. 357/20 |
| 5,493,133 A | * | 2/1996 | Duvvury et al. ............. 257/111 |
| 5,705,841 A | * | 1/1998 | Yu ............................... 257/355 |
| 5,729,420 A | * | 3/1998 | Joung .......................... 361/111 |
| RE36,024 E | * | 1/1999 | Ho et al. ..................... 257/356 |
| 5,889,309 A | * | 3/1999 | Yu et al. ...................... 257/363 |
| 5,949,109 A | * | 9/1999 | Shimizu et al. .............. 257/355 |
| 5,962,898 A | * | 10/1999 | Duvvury ...................... 257/355 |
| 6,046,476 A | * | 4/2000 | Morishita et al. ........... 257/347 |
| 6,163,056 A | * | 12/2000 | Mackawa .................... 257/355 |
| 6,246,122 B1 | * | 6/2001 | Lin .............................. 257/786 |

OTHER PUBLICATIONS

Wolf, S., *Silicon Processing for the VLSI Era, vol. 2* , (1990), 559–561.

* cited by examiner

*Primary Examiner*—Ngân V. Ngô
(74) *Attorney, Agent, or Firm*—Schwegman, Lundberg, Woessner & Kluth, P.A.

(57) ABSTRACT

An electrostatic discharge (ESD) protection device is provided. The ESD protection device includes a substrate, a first and a second doped region formed in the substrate. The first and second doped regions are separated from each other by only the substrate region. The ESD protection device includes no gate above the first and second doped regions. Furthermore, the distance separating the first and second doped regions is defined by a length of a resist during a process of forming the ESD protection device.

36 Claims, 7 Drawing Sheets

ELECTROSTATIC DISCHARGE PROTECTION DEVICE

TECHNICAL FIELD OF THE INVENTION

The present invention relates generally to integrated circuits, and in particular to electrostatic discharge (ESD) devices.

BACKGROUND OF THE INVENTION

An electrostatic discharge (ESD) event involves a high voltage or a large current inadvertently surging through a conductive path. If the path includes a pin or an external bonding pad and an internal circuit of an integrated circuit (IC), then the large current of the ESD event can surge through the pad and damage the internal circuit and thus the entire IC.

To protect the IC from damage caused by an ESD event, many ESD protection devices have been designed. Among them is a snapback-based ESD protection device. Conventionally, there are two types of snapback-based ESD protection devices. These two types include field-oxide NPN and thin-oxide NPN devices. Thin-oxide NPN devices are also known as NMOS devices. Although the performance of these devices is acceptable, each of them has its problems and limitations.

In general, problems associated with snapback-based NPN structures involves junction leakage failures following an ESD event. In addition, gate-oxide at the input-buffer can be damaged if the snapback voltage of the protection device is too high. The high snapback voltage can also cause damage to the gate-oxide in the protection device itself for a thin-oxide NPN device. These issues can lead to undesirable or substandard performance of the ESD protection device.

For the reasons stated above, and for other reasons stated below which will become apparent to those skilled in the art upon reading and understanding the present specification, there is a need in the art for an improved ESD protection device which is less susceptible to failures seen in the present NPN snapback ESD protection devices.

SUMMARY OF THE INVENTION

The problems and limitations associated with ESD protection devices are addressed by the present invention and will be understood by reading the following disclosure. A novel ESD protection device overcomes the problems and limitations of the prior art ESD protection devices. The ESD protection device according to the invention is less susceptible to failures seen in the present NPN snapback ESD protection devices.

In one aspect, the ESD protection device includes a substrate, a first doped region formed in the substrate, and a second doped region formed in the substrate. The first and second doped regions are separated from each other by only the substrate region. In addition, the ESD protection device includes no gate above the first and second doped regions.

In another aspect, a method of producing a semiconductor device includes masking a substrate with a resist. Then a first and a second doped region are formed in the substrate. The first and second doped regions are separated by only the substrate, and a spacing between the first and second doped regions is defined by a length of the resist. Furthermore, the method includes not forming a gate above the first and second doped regions.

DETAILED DESCRIPTION OF THE INVENTION

The following detailed description of the embodiments refers to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been used to form wells/junctions in the base semiconductor structure, and terms wafer or substrate include the underlying layers containing such wells/junctions. The following detailed description is, therefore, not to be taken in a limiting sense, and the scope of the present invention is defined only by the appended claims and equivalents thereof.

Figure 1:
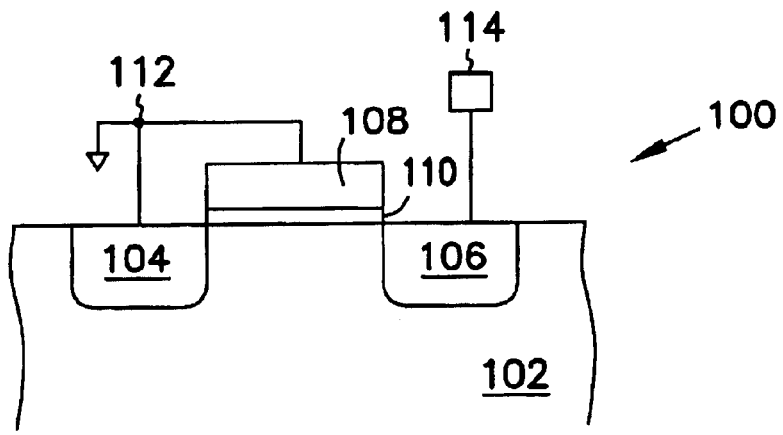
FIG. 1 is a prior art thin-oxide NPN ESD protection device.

FIG. 1 is a prior art thin-oxide NPN ESD protection device. Device 100 includes a p-type substrate 102 having an n-type source and drain regions 104 and 106. A gate 108 is separated from the substrate by a thin layer of gate oxide 110. Gate 108 and source region 104 is connected to a ground at node 112. Drain region 106 is connected to an external bonding pad 114. In a normal condition, device 100 is not conductive. During an ESD event, a high voltage occurs at external bonding pad 114. When the voltage reaches a breakdown voltage level of a p-n junction (substrate/drain junction) of device 100, the device becomes conductive. A large amount of current starts to flow between source and drain regions 104 and 106. The current flow effectively reduces the high voltage at external bonding pad 114 thus protecting any internal circuit connected to external bonding pad 114.

One problem associated with device 100 of FIG. 1 involves the integrity of the gate oxide. The gate oxide can be put under a tremendous stress or even be ruptured during an ESD event. In device 100, a high electric field developed (due to high voltage at pad 114) at the region underneath gate oxide 110 near the edge of drain 106 can rupture gate oxide 110. The high electric field can be reduced by connecting a resistor between node 112 and gate 108. However, the device still suffers from other factors. During the ESD event, a high temperature at the gate-drain edge is generated by the power dissipation created by a large amount of current flowing from drain 106 to source 104 during a snapback operation. The high temperature along with the high electrical field, can escalate the stress or cause damage to the gate oxide. Moreover, the high temperature can also melt the portion of substrate 102 underneath gate oxide 110, near drain 106. Furthermore, device 100 is also susceptible to a leakage failure due to impact ionization, a well-known phenomenon to those skilled in the art. Impact ionization at the edge of drain 106 causes carriers (electrons or holes) to be trapped in gate oxide 110. These trapped carriers cause a leakage path between drain 106 and substrate 102 and eventually contribute to undesirable performance or failure of the device.

Figure 2A:
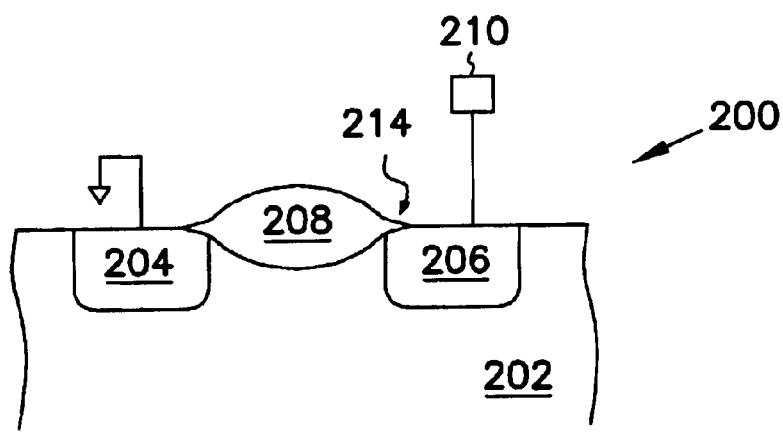
FIG. 2A is a prior art field-oxide NPN ESD protection device.

FIG. 2A is a prior art field-oxide NPN ESD protection device. In the Figure, device 200 includes a p-type substrate 202 having an n-type source and drain regions 204 and 206 which are separated by an isolation structure 208. Source region 204 is connected to a ground. Drain region 206 is connected to an external bonding pad 210. In a normal condition, device 200 is not conductive. During an ESD event, a high voltage occurs at external bonding pad 210. When the voltage reaches a breakdown voltage level of the p-n junction (substrate/drain junction) of device 200, the device becomes conductive. A large amount of current starts to flow between source and drain regions 204 and 206. The current flow effectively reduces the high voltage at external bonding pad 210, thus, protecting any internal circuit connected to external bonding pad 210.

Figure 2B:
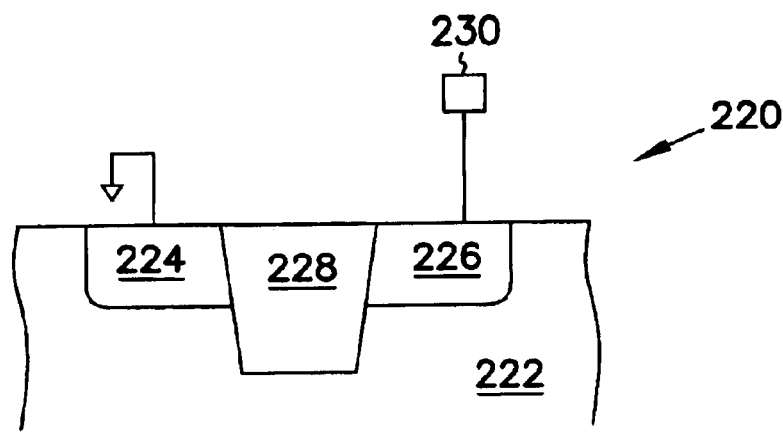
FIG. 2B is another prior art field-oxide NPN ESD protection device.

FIG. 2B is another prior art field-oxide NPN ESD protection device. In the Figure, device 220 includes a p-type substrate 222 having an n-type source and drain regions 224 and 226 which are separated by an isolation structure 228. Source region 224 is connected to a ground. Drain region 226 is connected to an external bonding pad 230. In a normal condition, device 220 is not conductive. During an ESD event, a high voltage occurs at external bonding pad 230. When the voltage reaches a breakdown voltage level of the p-n junction (substrate/drain junction) of device 220, the device becomes conductive. A large amount of current starts to flow between source and drain region 224 and 226. The current flow effectively reduces the high voltage at external bonding pad 230 thus protecting any internal circuit connected to external bonding pad 230.

One problem associated with device 220 of FIG. 2B, includes a reduction of the feedback efficiency of the device.

Referring to FIG. 2B, when device 220 is conductive, current flows from source 224 to drain 226. Since isolation structure 228 is positioned between the source and drain, current has to flow down from source 224, around structure 228, and then up to drain 226. Thus the current path is longer, and the direction is changed along the path. These two factors reduce the efficiency of the flow of the current resulting in an increase in snapback voltage. The increase in snapback voltage may require a larger device size so that the pad voltage during the ESD event does not increase because the increase in pad voltage could cause damage to the internal circuitry of the IC. However, a larger device size has its disadvantages. It increases total area of the IC. It also increases input capacitance. In addition, the increase in snapback voltage also causes an increase in power dissipation. The increase in power dissipation can cause stress to the device leading to substandard performance. It can also cause damage to the device leading to failure to protect the internal circuity of the IC.

Figure 3:
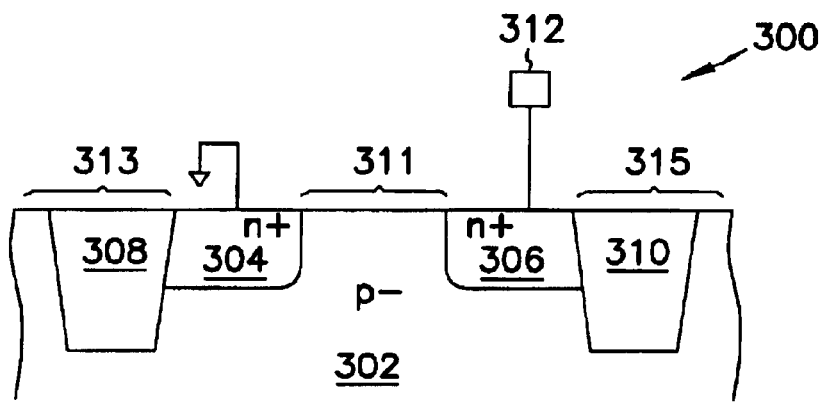
FIG. 3 is an ESD protection device according to the invention.

FIG. 3 is a novel ESD protection device according to the invention. Device 300 includes a substrate 302 having a first doped (source) region 304 and a second doped (drain) region 306. First doped region 304 and second doped region 306 are separated by only a region 311 of substrate 302. In one embodiment, substrate 302 has a p-type conductivity material, and first and second doped regions 304 and 306 have an n-type conductivity material. First and second doped regions 304 and 306 have a higher doping concentration than the doping concentration of substrate 302. In other words, substrate 302 is lightly doped (indicated by p−) and first and second doped regions 304 and 306 are heavily doped (indicated by n+). In addition, first doped region 304 can be connected to a ground at node 320. Those of ordinary skill in the art can readily recognize that first doped region 304 can also be connected to a voltage source or a power source. Second doped region 306 can be connected to an external bonding pad 312. Furthermore, since device 300 of FIG. 3 includes no gate structure above the first and second doped regions 304 and 306, it is a gateless ESD protection device.

Device 300 further comprises a first isolation structure 308 and a second isolation structure 310. First isolation structure 308 is placed on an opposing side, side 313, of the first doped region from substrate region 311. Second isolation structure 310 is placed on an opposing side, side 315, of the second doped region from substrate region 311. The isolation structures are designed to isolate device 300 from other adjacent components within the IC.

As shown in FIG. 3, device 300 has no gate oxide. Since device 300 has no gate oxide, it does not suffer from gate oxide rupture problem and leakage failure as in the case of a thin-oxide device. Thus, this is one advantage of device 300 of the invention over the prior art device 100 shown in FIG. 1. Device 300 also has no isolation structure positioned between source region 304 and drain region 306. Thus, current can travel in a shorter path and directly from source region 304 to drain region 306 and without changing direction. Therefore, the issue of high snapback voltage, as in the case of a field-oxide device 220, is avoided. In addition, since device 300 includes no gates structure, when it conducts, an amount of current flowing between the first and second doped regions 304 and 306 is not controlled by a voltage potential of a gate above the first and second doped regions.

Figure 4:
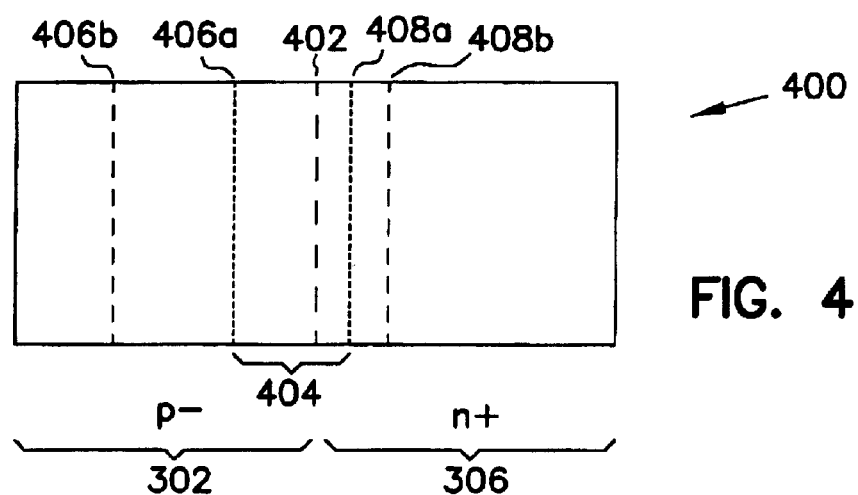
FIG. 4 illustrates a p-n junction of the ESD protection device of FIG. 3.

FIG. 4 illustrates a p-n junction of ESD protection device 300 of FIG. 3. In the Figure, p-n junction 400 depicts the junction between p-type substrate 302 and n-type second doped region 306 when a reverse-bias voltage is applied to external bonding pad 312. In FIG. 4, p-n junction 400 includes a center 402 and a space charge region 404. The space charge region exists due to the difference in conductivity types of (p-type) substrate 302 and the (n-type) first and second doped regions 304 and 306. Space charge region 404 has a first boundary 406a and a second boundary 408. The first and second boundaries 406a and 408a are not symmetrical with reference to center 402. As shown in FIG. 4, from center 402, first boundary 406a extends more into substrate 302 because second doped region 306 is heavily doped and substrate 302 is lightly doped. In an alternate embodiment, those of ordinary skill in the art will readily recognize that substrate 302 and first and second doped regions 304 and 306 can have the same doping concentration. In that case, first and second boundaries 406a and 408a will symmetrically extend from the center.

When the reverse-bias voltage at external bonding pad 312 increases, space charge region 404 expands predominantly into substrate 302. As shown in FIG. 4, first boundary 406a expands to a position indicated at 406b, and second boundary 408a expands to a position indicated at 408b. As the reverse-bias voltage at external bonding pad 312 increases, the width of space charge region 404 becomes wider. When the reverse-bias voltage reaches a voltage level known as reverse-bias breakdown voltage or breakover voltage (Vbv), current begins to flow between second doped region 306 and the substrate 302, which is the initiation of the negative resistance region leading to snapback conduction between the doped region 306 and 304. Snapback conduction is not described herein as it is a phenomenon known to those of ordinary skill in the art.

Figure 5:
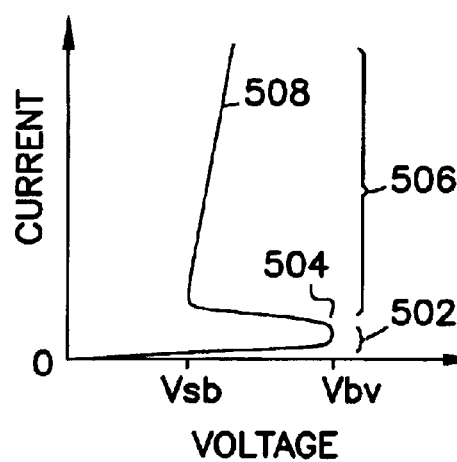
FIG. 5 is a current versus voltage graph of the ESD protection device of FIG. 3 during an operating mode.

FIG. 5 illustrates a current vs. voltage graph of the ESD protection device of FIG. 3 operating in a snapback mode. As shown in FIG. 5, when a reverse-bias voltage at external bonding pad 312 is less than the breakover voltage (Vbv), there is little or an insignificant amount of current flowing. As indicated in the graph, at region 502 the current is near zero. When the reverse-bias voltage reaches the breakover voltage (Vbv) as shown at point 504, device 300 starts to operate in a snapback mode and pulls the voltage at external bonding pad 312 to a snapback voltage (Vsb) as shown at region 506. The current flows with low impedance in the snapback mode, as indicated by line 508 with a steep slope. The steep slope also indicates that the device has a low resistance between the first and second doped regions during the snapback mode. The flow of current effectively lowers the voltage at external bonding pad 312 to a safe level while conducting large currents.

Figure 6A:
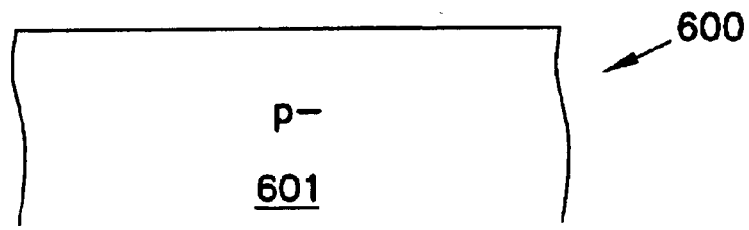
FIGS. 6A–C illustrate cross-sectional views of an ESD protection device at various processing stages according to one embodiment of the invention.
Figure 6B:
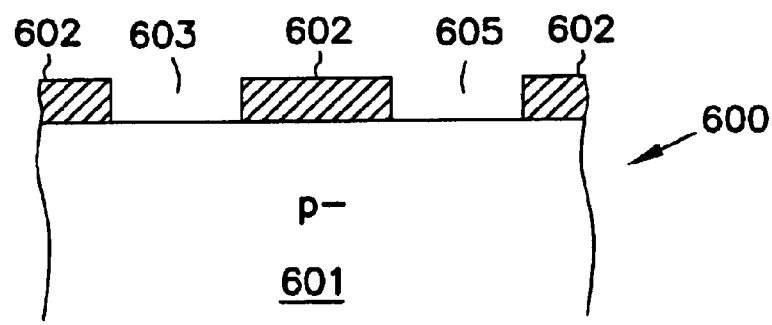
Figure 6C:
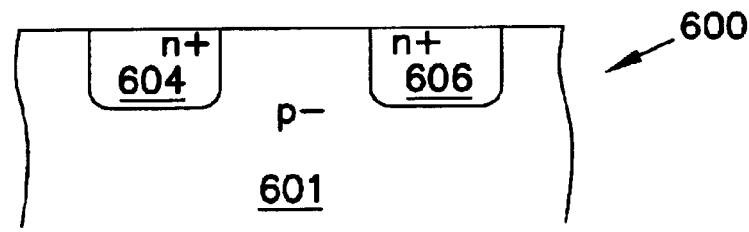

FIGS. 6A–C illustrate cross-sectional views of an ESD protection device 600, at various processing stages according to one embodiment according to the invention. FIG. 6A shows a substrate 601. An implant process introduces p-type dopants into the substrate. In one embodiment, introducing p-type dopants forms a lightly doped substrate (p−) 601. In FIG. 6B, a resist 602 masks substrate 601 to expose a first and second exposed areas 603 and 605 which define future doped regions. An implant process introduces n-type dopants to the exposed areas 603 and 605. In one embodiment, introducing n-type dopants forms heavily doped first and second regions 604 and 606. In FIG. 6C, after the resist is removed, device 600 has been formed which includes a first active region or an n-type first doped region 604, and a second active region or an n-type second doped region 606 separated by a portion of the p-type substrate 601. Furthermore, the space separating the first and second doped regions 604 and 606 is defined by the length of resist 602.

Figure 7A:
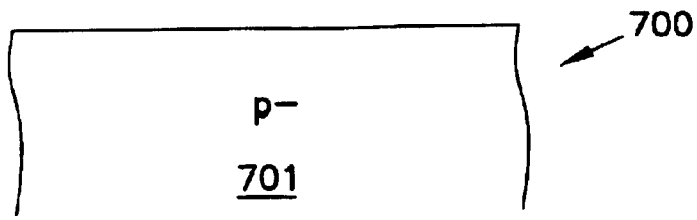
FIGS. 7A–E illustrate cross-sectional views of an ESD protection device at various processing stages according to another embodiment of the invention.
Figure 7B:
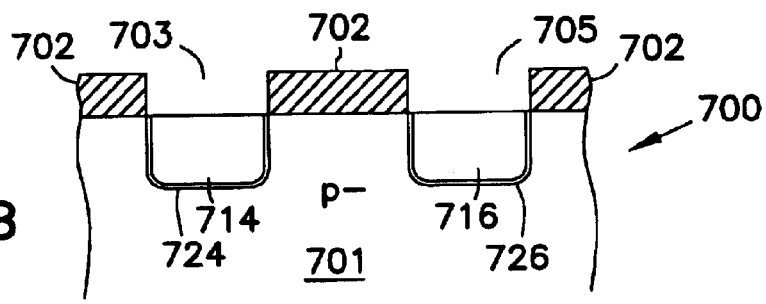

FIGS. 7A–E illustrate cross-sectional views of an ESD protection device 700, at various processing stages according to another embodiment of the invention. In FIG. 7A, an implant process introduces p-type dopants into a substrate 701. In one embodiment, introducing p-type dopants forms a lightly doped substrate (p−) 701. In FIG. 7B, a resist 702 masks substrate 701 to expose a first and second exposed areas 703 and 705 which define future doped regions. A first implant process introduces p-type dopants into the exposed areas to form a first and a second p-type (p-type halo) doped regions 724 and 726. After that, a second implant introduces n-type dopants into the exposed areas to form a first and second n-type lightly doped (LDD) regions 714 and 716.

Figure 7C:
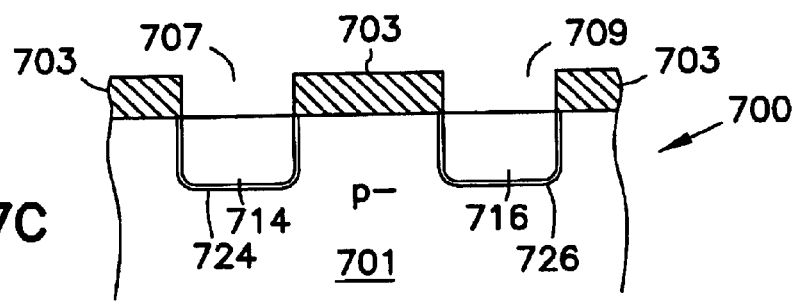
Figure 7D:
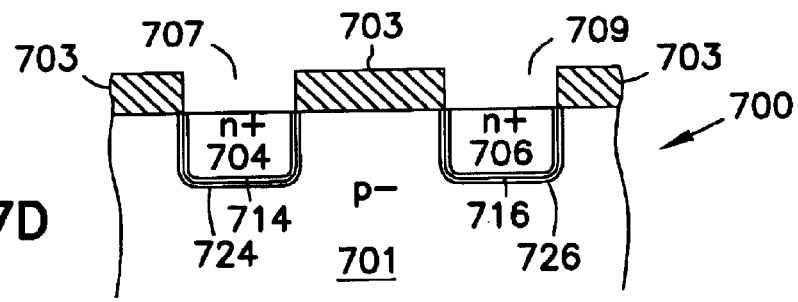
Figure 7E:
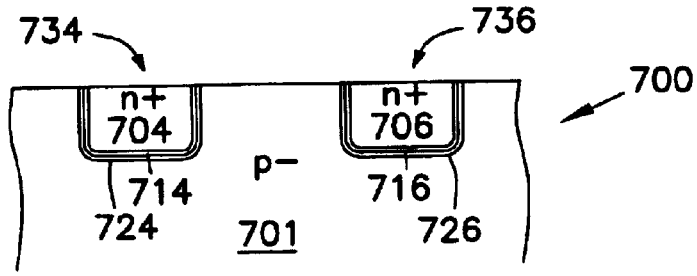

In FIG. 7C, resist 702 is removed, and another resist 703 masks substrate 701 to expose areas 707 and 709. In FIG. 7D, a third implant process introduces n-type dopants to the exposed areas to form a first (source) and second (drain) n-type heavily doped regions 704 and 706 (n+). In FIG. 7E resist 703 is removed to complete device 700. Device 700 includes two active regions 734 and 736. Each of the active regions includes a source/drain region 704 or 706, an LDD region 714 or 716 and a halo region 724 or 726. As shown in FIG. 7E, the source/drain, LDD and halo regions have different depths. Halo regions 724 and 726 have a first depth. LDD regions 714 and 716 have a second depth, which is shallower than the first depth. And source and drain region 704 and 706 have a third depth which is shallower than the second depth.

Figure 8A:
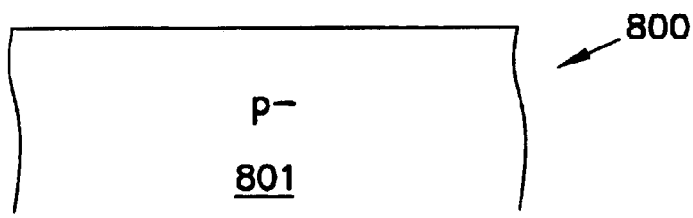
FIGS. 8A–E illustrate cross-sectional views of an ESD protection device at various processing stages according to another embodiment of the invention.
Figure 8B:
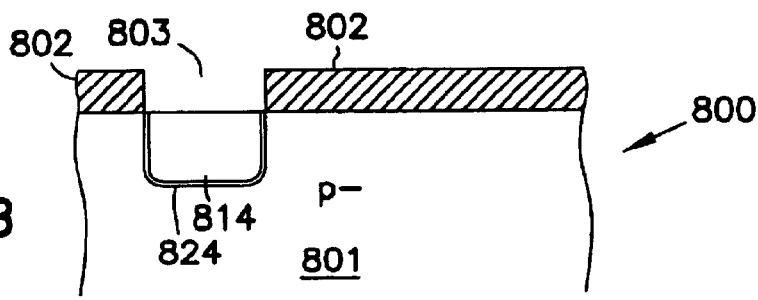

FIGS. 8A–E illustrate cross-sectional views of an ESD protection device 800, at various processing stages according to another embodiment according to the invention. In FIG. 8A, an implant process introduces p-type dopants into a substrate 801. In one embodiment, introducing p-type dopants forms a lightly doped substrate (p−) 801. In FIG. 8B, a resist 802 masks substrate 801 to expose an exposed area 803 which define future doped region. A first implant process introduces p-type dopants into the exposed area to form a p-type (p-type halo) doped regions 824. After that, a second implant introduces n-type dopants into the exposed area to form an n-type lightly doped (LDD) regions 814.

Figure 8C:
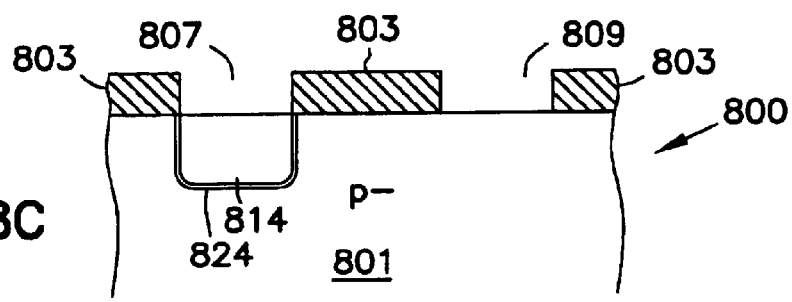
Figure 8D:
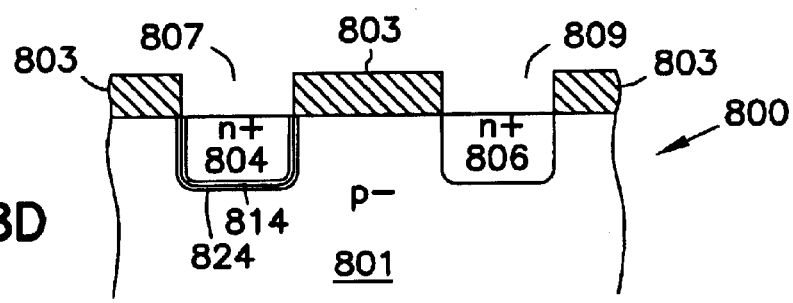
Figure 8E:
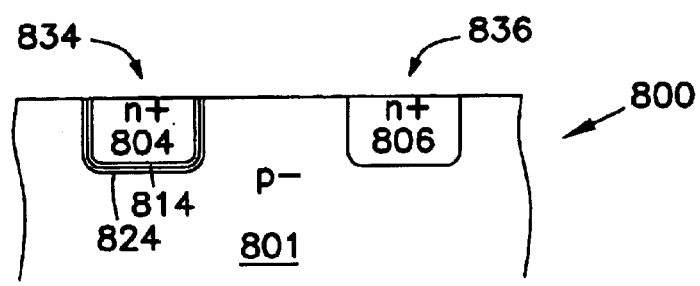

In FIG. 8C, resist 802 is removed, and another resist 803 masks substrate 801 to expose exposed areas 807 and 809. In FIG. 8D, a third implant process introduces n-type dopants to the exposed areas to form a first (source) and second (drain) n-type heavily doped regions 804 and 806 (n+). In FIG. 8E resist 803 is removed and device 800 has been formed. Device 800 includes first and second active regions 834 and 836, each of which includes a source/drain region 804 or 806. First region 804 further includes LDD region 814 and halo region 824. Halo region 824 surrounds LDD region 814, which in turn, surrounds source/drain region 804.

Figure 9A:
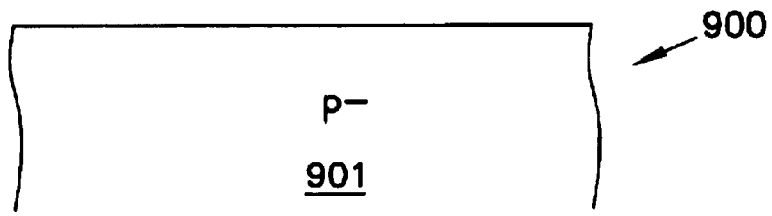
FIGS. 9A–E illustrate cross-sectional views of an ESD protection device at various processing stages according to another embodiment of the invention.
Figure 9B:
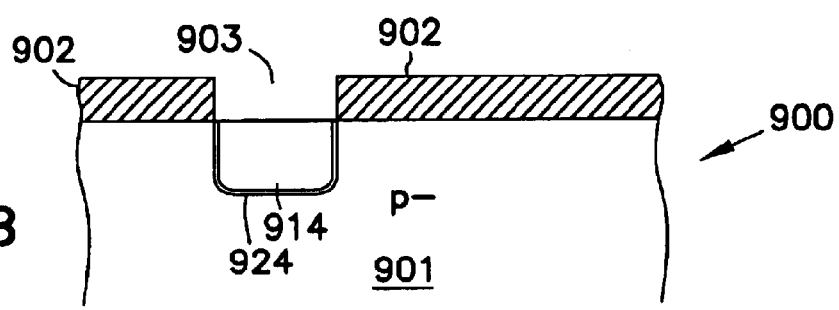

FIGS. 9A–E illustrate cross-sectional views of an ESD protection device 900, at various processing stages according to another embodiment according to the invention. In FIG. 9A, a substrate 901 is provided. In one embodiment, introducing p-type dopants forms a lightly doped substrate (p−) 901. In FIG. 9B, a resist 902 masks substrate 901 to expose an area 903. A first implant process introduces p-type dopants into the exposed area to form a p-type (p-type halo) doped regions 924. After that, a second implant introduces n-type dopants into the exposed area to form an n-type lightly doped (LDD) regions 914.

Figure 9C:
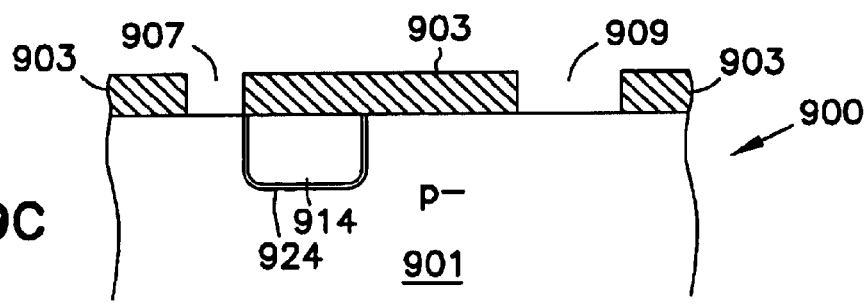
Figure 9D:
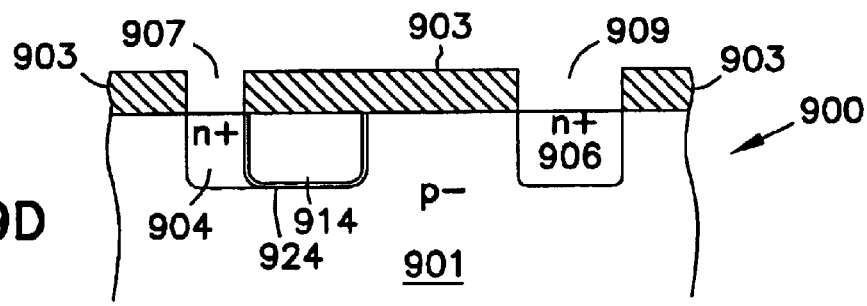
Figure 9E:
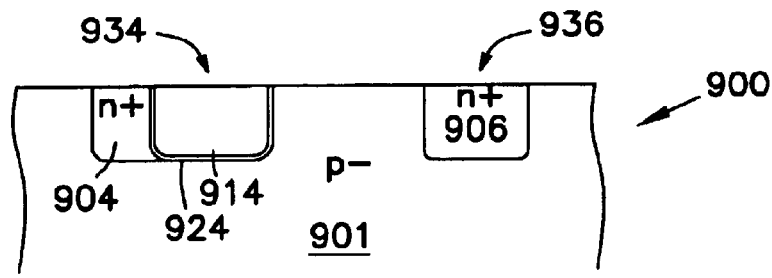

In FIG. 9C, resist 902 is removed. Another resist 903 masks substrate 901 and regions 914 and 924 to expose areas 907 and 909. In FIG. 9D, a third implant process introduces n-type dopants to exposed areas 903 and 905 to form a source/drain region 906 and an ohmic-contact region 904. Regions 906 and 904 have a higher doping concentration than a doping concentration of n-type LDD region 914. In FIG. 9E resist 903 is removed to form device 900. Device 900 includes first and second active regions 934 and 936. First active region 934 includes LDD region 914, halo region 924 surrounding LDD region 914, and ohmic-contact region 904 adjacent to halo region 924. Second active region 936 include source/drain region 906.

The halo and LDD regions described in the processes of forming devices 700, 800 and 900 provide one advantage. They allow a shorter and more stable device, which provides lower impedance. However, forming the halo and LDD regions introduces the misalignment between the mask steps.

The processes described above regarding devices 600, 700, 800 and 900 are not exclusive. Other processes or steps can be used to achieve the same purpose. In some embodiments, more mask steps can be used between implants, or multiple implants can be introduced and some of which may be grouped into common mask step. For example, in one embodiment, an additional mask can be used between the halo and the LDD implants. In another embodiment, more or less implants other than the halo, LDD and source/drain can be introduced, and they can be grouped into common mask step.

In addition, other variations of devices 600, 700, 800 and 900 described above can readily achieve the same advantages provided by devices 600–900 of the invention. For example, in one other embodiment, a device similar to any of the devices 600–900 includes the halo and LDD implants on both sides without a source/drain implant on either side. In such embodiment, a source/drain implant can be introduced in an immediate proximity of the halo and LDD implants to provide the ohmic contacts. In yet another embodiment, a device similar to any of the devices 600–900 includes the halo and LDD implants on both sides, and either the source or the drain is included in only one side.

Figure 10:
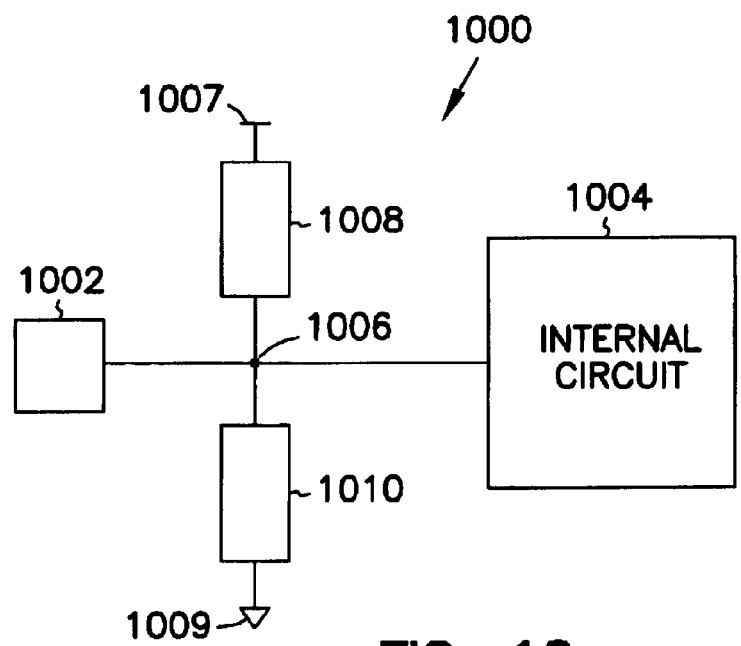
FIG. 10 is a block diagram of an integrated circuit having the ESD protection device according to the invention.

FIG. 10 is a block diagram of an integrated circuit 1000 having an ESD protection device according to the invention. Integrated circuit 1000 includes an external bonding pad 1002 connected to an internal circuit 1004 at node 1006. A first ESD protection device 1008 is connected between node 1006 and a first voltage source 1007. A second ESD protection device 1010 is connected between node 1006 and a second voltage source 1009. ESD protection devices 1008 or 1010 represents the ESD protection devices 300, 600, 700, 800 or 900 according to the invention. The first voltage source is substantially greater than the second voltage source. For example, the first voltage source can be a voltage supply (or the operating voltage of the device) and the second voltage source can be a ground.

In a normal condition, ESD protection devices 1008 and 1010 do not conduct. During an ESD event, a high voltage occurs at bonding pad 1002. When the voltage reaches the breakover voltage of the ESD protection devices 1008 and 1010, the devices begin to conduct and pull the voltage at external bonding pad 1002 back to the level of the snapback voltage and operate in a snapback mode. By operating in the snapback mode, the voltage at node 1006 remains close to the level of the snapback voltage. Therefore, according to the teaching of the invention, internal circuit 1004 is protected by the ESD protection devices from the ESD event.

Figure 11:
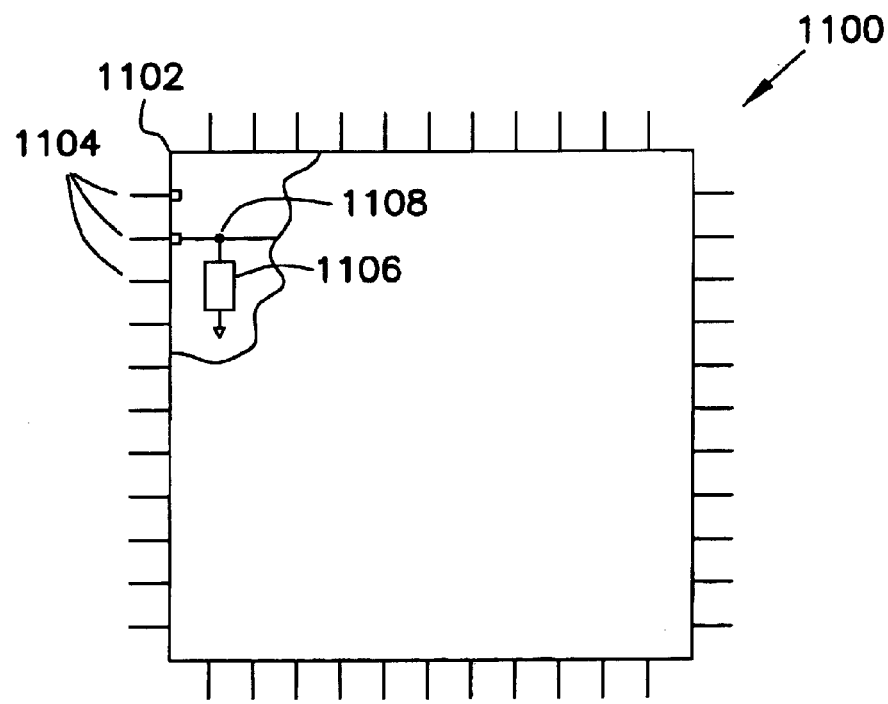
FIG. 11 is a block diagram of a semiconductor chip having an ESD protection device according to the invention.

FIG. 11 is a block diagram of a semiconductor chip having an ESD protection device according to the invention. In the Figure, chip 1100 includes a package 1102 having plurality of pins 1104. As shown in a partially cut-away view, at least one of the pins of the package is connected to at least one ESD protection device 1106 of the present invention at a node 1108. Device 1104 protects the chip from an ESD event and can be any of the ESD protection devices according to the invention, such as device 300, 600, 700, 800 or 900.

Conclusion

A novel ESD protection device is provided which overcomes the problems and limitations of the prior art ESD protection devices. The ESD protection device according to the invention is less susceptible to failures seen in the present NPN snapback ESD protection devices.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An electrostatic discharge (ESD) protection device comprising:
   a substrate;
   a first doped region formed in the substrate for connecting to a bonding pad; and
   a second doped region formed in the substrate for connecting to a power node, wherein the second doped region is separated from the first doped region by only the substrate region, wherein the ESD protection device comprises no gate above the first and second doped regions, wherein the ESD protection device comprises no isolation structure between the first and second dope regions, and wherein the first and second doped regions are positioned such that current flows in one direction between the bonding pad and the power node through the substrate.

2. The ESD protection device of claim 1, wherein the substrate comprises a first conductivity type and the first and second doped regions comprise a second conductivity type.

3. The ESD protection device of claim 1, wherein the substrate comprises a p-type conductivity material and the first and second doped regions comprise an n-type conductivity material.

4. The ESD protection device of claim 1, wherein first and second doped regions comprise a higher doping concentration than a doping concentration of the substrate.

5. The ESD protection device of claim 1 further comprising a first isolation structure placed on an opposing side of the first doped region from a region separating the first and the second doped regions, and a second isolation structure placed on an opposing side of the second doped region from a region separating the first and the second doped regions.

6. An electrostatic discharge (ESD) protection device comprising:
   a substrate;
   a first doped region formed in the substrate for connecting to a bonding pad; and
   a second doped region formed in the substrate for connecting to a power node, wherein the second doped region is separated from the first doped region by only the substrate region, wherein the ESD protection device is structured such that an amount current flowing between the first and second doped regions is not controlled by a voltage potential of a gate above the first and second doped regions, wherein the ESD protection device comprises no isolation structure between the first and second dope regions, and wherein the first and second doped regions are positioned such that current flows in one direction between the bonding pad and the power node through the substrate.

7. A gateless electrostatic discharge (ESD) protection device comprising:
   a substrate;
   a first doped region formed in the substrate for connecting to a bonding pad; and
   a second doped region formed in the substrate for connecting to a power node for receiving a power source, wherein the second doped region is separated from the first doped region by only the substrate region, wherein the gateless ESD protection device comprises no isolation structure between the first and second dope regions, and wherein the first and second doped regions are positioned such that current flows in one direction between the bonding pad and the power node through the substrate.

8. An electrostatic discharge (ESD) protection device comprising:
   a substrate; and
   an implant within the substrate, the implant including two implant regions spaced apart by only the substrate region, the two implant regions including a first implant region connected to a bonding pad, and a second implant region connected to a power node, wherein the substrate comprises a first conductivity type and the two implant regions comprise a second conductivity type, wherein the ESD protection device is structured such that a conductivity between the two implant regions is not controlled by voltage potential of a gate above the two implant regions, wherein the ESD protection device comprises no isolation structure between the first and second implant regions, and wherein the first and second implant regions are positioned such that current flows in one direction between the bonding pad and the power node through the substrate.

9. An integrated circuit comprising:
   a voltage source;
   an external bonding pad; and
   an electrostatic discharge (ESD) protection device connected between the external bonding pad and the voltage source, the ESD protection device comprising:
      a substrate;
      a first doped region formed in the substrate and connected to the external bonding pad; and
      a second doped region formed in the substrate and connected to the voltage source, wherein the second doped region is separated from the first doped region by only the substrate region, wherein the ESD protection device comprises no gate above the first and second doped regions, wherein the ESD protection device comprises no isolation structure between the first and second dope regions, and wherein the first and second doped regions are positioned such that current flows in one direction between the external bonding pad and the voltage source through the substrate.

10. The ESD protection device of claim 9, wherein the substrate comprises a first conductivity type and the first and second doped regions comprise a second conductivity type.

11. The ESD protection device of claim 9, wherein the substrate comprises a p-type conductivity material and the first and second doped regions comprise an n-type conductivity material.

12. The ESD protection device of claim 9, wherein first and second doped regions comprise a higher doping concentration than a doping concentration of the substrate.

13. The integrated circuit of claim 9, wherein the voltage source is connected to ground.

14. The integrated circuit of claim 9, wherein the voltage source is connected to a voltage supply.

15. An integrated circuit comprising:
   a first voltage source;
   a second voltage source;
   an external bonding pad;
   a first electrostatic discharge (ESD) protection device connected between the first voltage source and the external bonding pad; and
   a second ESD protection device connected between the second voltage source and the external bonding pad, wherein the second ESD protection device comprising:
      a substrate;
      a first doped region formed in the substrate and connected to the external bonding pad; and
      a second doped region formed in the substrate and connected to the second voltage source, wherein the second doped region is separated from the first doped region by only the substrate region, wherein the second ESD protection device comprises no gate above the first and second doped regions, wherein the second ESD protection device comprises no isolation structure between the first and second dope regions, and wherein the first and second doped regions are positioned such that current flows in one direction between the external bonding pad and the second voltage source through the substrate.

16. The integrated circuit of claim 15, wherein the first voltage source is substantially smaller than the second voltage source.

17. The integrated circuit of claim 15, wherein the first voltage source is connected to ground.

18. The integrated circuit of claim 15, wherein the second voltage source is connected to a voltage supply.

19. An integrated circuit comprising:
   a voltage source;
   an external bonding pad;
   an internal circuit connected to the external bonding pad at a node; and
   an electrostatic discharge (ESD) protection device connected between the node and the voltage source, the ESD protection device comprising:
      a first doped region formed in the substrate and connected to the external bonding pad; and
      a second doped region formed in the substrate and connected to the voltage source, wherein the second doped region is separated from the first doped region by only the substrate region, wherein the ESD protection device comprises no gate above the first and second doped regions, wherein the ESD protection device comprises no isolation structure between the first and second dope regions, and wherein the first and second doped regions are positioned such that current flows in one direction between the external bonding pad and the voltage source through the substrate.

20. An integrated circuit comprising:
a first voltage source;
a second voltage source;
an external bonding pad;
an internal circuit connected to the external bonding pad at a node;
a first electrostatic discharge (ESD) protection device connected between the first voltage source and the node; and
a second ESD protection device connected between the second voltage source and the node, wherein the second ESD protection device comprising:
 a substrate;
 a first doped region formed in the substrate and connected to the external bonding pad; and
 a second doped region formed in the substrate and connected to the second voltage source, wherein the second doped region is separated from the first doped region by only the substrate region, wherein the second ESD protection device comprises no gate above the first and second doped regions, wherein the second ESD protection device comprises no isolation structure between the first and second dope regions, and wherein the first and second doped regions are positioned such that current flows in one direction between the external bonding pad and the second voltage source through the substrate.

21. A semiconductor chip comprising:
a package having a plurality of pins; and
an electrostatic discharge (ESD) protection device connected to at least one of the pins, the protection device comprising:
 a substrate;
 a first doped region formed in the substrate for connecting to the at least one of the pins; and
 a second doped region formed in the substrate for connecting to a power node, wherein the second doped region is separated from the first doped region by only the substrate region, wherein the ESD protection device comprises no gate above the first and second doped regions, wherein the ESD protection device comprises no isolation structure between the first and second dope regions, and wherein the first and second doped regions are positioned such that current flows in one direction between the at least one of the pins and the power node through the substrate.

22. A chip comprising:
a package having a plurality of pins; and
a protection device connected to at least one of the pins, the protection device comprising:
 a substrate;
 a first doped region formed in the substrate and connected to the at least one of the pins; and
 a second doped region formed in the substrate for connecting to a power node, wherein the second doped region is separated from the first doped region by only the substrate region, wherein the protection device comprises no isolation structure between the first and second dope regions, and wherein the first and second doped regions are positioned such that current flows in one direction between the at least one of the pins and the power node through the substrate.

23. A chip comprising:
a package having a plurality of pins; and
a protection device connected to at least one of the pins, the protection device comprising:
 a substrate; and
 an implant within the substrate, the implant including two implant regions spaced apart by only the substrate region, the two implant regions including a first implant region connected to the at least one of the pins, and a second implant region connected to a power node, wherein the substrate comprises a first conductivity type and the two implant regions comprise a second conductivity type, wherein the protection device is structured such that a conductivity between the two implant regions is not controlled by voltage potential of a gate above the two implant regions, wherein the protection device comprises no isolation structure between the first and second implant regions, and wherein the first and second doped regions are positioned such that current flows in one direction between the bonding pad and the power node through the substrate.

24. A chip comprising:
a package having a plurality of pins; and
a protection device connected to at least one of the pins, the protection device comprising:
 a substrate;
 a first doped region formed in the substrate and connected to the at least one of the pins; and
 a second doped region formed in the substrate for connecting to a power node, wherein the second doped region is separated from the first doped region by only the substrate region such that an amount current flowing between the first and second doped regions is not controlled by a voltage potential of a gate above the first and second doped regions, wherein the protection device comprises no isolation structure between the first and second dope regions, and wherein the first and second doped regions are positioned such that current flows in one direction between the at least one of the pins and the power node through the substrate.

25. A circuit comprising:
a bonding pad;
a power node; and
a transistor connected between the bonding pad and the power node, the transistor including a substrate, a first doped region formed in the substrate, and a second doped region formed in the substrate, the transistor including no gate above the first and second doped regions, the transistor including no isolation structure between the first and second doped regions, the first doped region connecting to the bonding pad, the second doped region connecting to the power node, wherein the first and second doped regions are positioned such that current flows in one direction between the bonding pad and the power node through the transistor.

26. The circuit of claim 25, wherein the substrate includes a first conductivity type material and each of the first and second doped regions includes a second conductivity type material.

27. The circuit of claim 25, wherein the substrate includes a p-type conductivity material and each of the first and second doped regions includes an n-type conductivity material.

28. The circuit of claim 25 further comprising a first isolation structure formed next to the first doped region, and a second isolation structure formed next to the second doped region.

29. The ESD protection device of claim 7, wherein each of the first and second doped regions includes a source/drain region, a LDD region and a halo region, wherein the LDD region surrounds the source/drain region and the halo region surrounds the LDD region.

30. The ESD protection device of claim 29, wherein the substrate comprises a first conductivity type and the source/drain region comprises a second conductivity type.

31. The ESD protection device of claim 29, wherein the substrate comprises a p-type.

32. The ESD protection device of claim 30, wherein the LDD region comprises the same conductivity type as the conductivity type of the source/drain region, wherein a doping concentration of the LDD region is lower than a doping concentration of the source/drain region.

33. The ESD protection device of claim 30, wherein the halo region comprises the same conductivity type as the conductivity type of the substrate, wherein a doping concentration of the halo region is lower than a doping concentration of the substrate.

34. The ESD protection device of claim 7, wherein the first and second doped regions are located in a first implant comprises a first depth, wherein the ESD protection device further comprises a second implant inside the two first doped regions, the second implant comprising a second depth, wherein the second is shallower than the first depth; and a third implant inside the second implant, the third implant comprising a third depth, wherein the third depth is shallower than the second depth, and wherein the ESD protection device comprises no gate above the first, second and third implants.

35. The ESD protection device of claim 7, wherein the first doped region includes a first active region and the second doped region includes a second doped region, wherein each of the first and second active regions includes a source/drain region, wherein the first active region further includes an LDD region and a halo region, and wherein the LDD region surrounds the source/drain region and the halo region surrounds the LDD region.

36. The ESD protection device of claim 7, wherein the first doped region includes a first active region and the second doped region includes a second doped region, wherein the first active region includes an LDD region surrounded by a halo region and an ohmic-contact region adjacent to the halo region, wherein the second active region include a source/drain region.

* * * * *

UNITED STATES PATENT AND TRADEMARK OFFICE
CERTIFICATE OF CORRECTION

PATENT NO.    : 6,914,306 B1
DATED         : July 5, 2005
INVENTOR(S)   : Kenneth W. Marr It is certified that error appears in the above-identified patent and that said Letters Patent is hereby corrected as shown below:

Column 10,
Line 34, delete "wherein" before "the".
Line 53, below "comprising:" insert -- a substrate; --.

Column 13,
Line 10, after "p-type" insert -- conductivity material and the source/drain region comprises an n-type conductivity material --.
Line 22, after "implant" insert -- wherein the first implant --.
Line 26, after "second" insert -- depth --.

Signed and Sealed this

Thirty-first Day of January, 2006

JON W. DUDAS
*Director of the United States Patent and Trademark Office*